(12) United States Patent
Brady et al.

(10) Patent No.: US 6,441,440 B1
(45) Date of Patent: Aug. 27, 2002

(54) SEMICONDUCTOR DEVICE AND CIRCUIT HAVING LOW TOLERANCE TO IONIZING RADIATION

(75) Inventors: Frederick T. Brady, San Antonio, TX (US); Nadim Haddad, Oakton; Murty S. Polavarapu, Vienna, both of VA (US)

(73) Assignee: BAE SYSTEMS Information and Electronic Systems Integration Inc., DE (US)

( * ) Notice: Subject to any disclaimer, the term of this patent is extended or adjusted under 35 U.S.C. 154(b) by 0 days.

(21) Appl. No.: 09/590,806

(22) Filed: Jun. 9, 2000

Related U.S. Application Data
(60) Provisional application No. 60/138,721, filed on Jun. 11, 1999.

(51) Int. Cl.[7] ...................... H01L 29/772; H01L 31/119
(52) U.S. Cl. ........................................ 257/368; 257/324
(58) Field of Search ................................. 257/411, 369, 257/368, 288, 295, 310, 327, 351, 402, 408, 410, 921, 355, 356, 357, 360–363, 324

(56) References Cited

U.S. PATENT DOCUMENTS 6,064,102 A * 5/2000 Gardner et al. ............. 257/410
6,235,590 B1 * 5/2001 Daniel et al. ............... 438/275

* cited by examiner

Primary Examiner—Tom Thomas
Assistant Examiner—Douglas W. Owens
(74) Attorney, Agent, or Firm—DeMont & Breyer, LLC

(57) ABSTRACT

Semiconductor devices and integrated circuits that benefit from the advantages of contemporary processing technologies yet are irreparably damaged by ionizing radiation, and methods for making the same. Transistors that are particularly intolerant to ionizing radiation have a gate insulator that includes a portion of a screen layer that is used in conjunction with N- and P-well implantation. After the implantation step, the screen layer exhibits significantly degraded tolerance to ionizing radiation, so that a gate insulator incorporating a portion of such a screen layer will likewise be radiation intolerant. By selectively removing portions of the screen layer, a method is provided for co-locating radiation-tolerant and radiation-intolerant transistors on a substrate. A radiation intolerant integrated circuit is formed by adding "safeguard devices" to an integrated circuit. The safeguard devices are susceptible to relatively low doses of ionizing radiation while other "utile devices" on the integrated circuit are not. The safeguard devices are coupled to the utile devices in such a manner that when the integrated circuit is bombarded with ionizing radiation, the safeguard devices short and destroy the functionality of the utile devices, and, hence, the functionality of the integrated circuit.

10 Claims, 7 Drawing Sheets

SEMICONDUCTOR DEVICE AND CIRCUIT HAVING LOW TOLERANCE TO IONIZING RADIATION

CROSS-REFERENCE TO RELATED APPLICATION

This application claims priority of U.S. Provisional Application No. 60/138,721, filed Jun. 11, 1999, which is incorporated by reference herein.

FIELD OF THE INVENTION

The present invention relates to semiconductor processing and integrated circuits. More particularly, the present invention relates to semiconductor devices and circuits that have a low tolerance to ionizing radiation, and methods for manufacturing the same.

BACKGROUND OF THE INVENTION

Older semiconductor processing technologies produced integrated circuits that were highly susceptible to damage from ionizing radiation. Such ionizing radiation is emitted from a multitude of galactic sources (e.g., the Sun, etc.) and exists above the ionosphere, and is also emitted when nuclear weapons are detonated. The important consequence of such radiation susceptibility is that these integrated circuits were not well suited for use in satellites or in military applications. They could, therefore, be freely sold and exported without the fear that they would be used militarily against the United States and its allies.

In contrast, state-of-the-art semiconductor processing technologies currently produce integrated circuits that are highly tolerant to damage from ionizing radiation. Such tolerance results, among any other reasons, from a decrease in semiconductor-feature size (e.g., interconnect line width, etc.) in integrated circuits. In particular, the "gate oxide" or "gate insulator" in field effect transistors (FETs) has thinned to the point it is inherently tolerant to ionizing radiation.

The relatively high radiation tolerance of state-of-the-art circuits is no benefit to most users and for most applications. This characteristic does, however, allow such circuits to be used in aerospace and military applications. In fact, such circuits may be so radiation tolerant that Department of Defense export restrictions (ITAR) are implicated. Such export restrictions are financially detrimental to a commercial CMOS fabricator since they result in added expense and a shrunken market.

Thus, a need exists for a method that increases the susceptibility of semiconductor devices and integrated circuits to ionizing radiation so that they can be freely exported.

SUMMARY OF THE INVENTION

Some embodiments of the present invention provide a method for manufacturing semiconductor devices and circuits that have increased susceptibility to ionizing radiation. The inventive methods use well-known processing techniques. In fact, with the exception of a few processing steps, the inventive methods follow conventional CMOS processing methodology. As such, while devices and circuits that are produced in accordance with the present teachings are more susceptible to damage/aberrant operation from ionizing radiation than devices and circuits fabricated via conventional processes, they nevertheless possess the advantages of contemporary processing technologies (e.g., small feature size, etc.).

In accordance with the illustrated embodiment of the present invention, a radiation susceptible device, such as a FET, is fabricated by forming a screen layer on a substrate; implanting said substrate with a dopant through said screen layer; selectively removing a portion of said screen layer; and forming an electrically-insulating layer on said screen layer. Conventional CMOS processing steps are used to complete the devices. A device exhibiting increased radiation susceptibility is formed at a location at which the screen layer is not removed. A device exhibiting a "standard" or otherwise unaffected susceptibility (relative to conventional CMOS processing procedures) is formed at a location at which the screen layer is removed.

In a further embodiment, a method of operating an integrated circuit in accordance with the present invention comprises: processing signals with a utile device; and interfering with the operation of the utile device with a safeguard device comprising a transistor having a gate insulator that includes a screen layer, wherein the safeguard device interferes with the operation of said utile device when and only when said integrated circuit is exposed to ionizing radiation.

In additional embodiments, the present invention provides an integrated circuit exhibiting increased susceptibility to ionizing radiation, and a method for fabricating such a circuit. An integrated circuit fabricated in accordance with the inventive method comprises (1) "utile" devices that provide the functionality for which the circuit was designed, and (2) safeguard devices that impart the integrated circuit's increased susceptibility to ionizing radiation. In some embodiments, a utile device comprises a first transistor that is disposed on a region of a substrate at which a screen layer is removed, and a safeguard device comprises a second transistor disposed on a region of substrate at which said screen layer is not removed.

In one embodiment of such an integrated circuit, safeguard devices are coupled into the logic of the integrated circuit in such a manner that when the integrated circuit is exposed to ionizing radiation, the safeguard devices irreparably destroy the functionality of the integrated circuit.

In general, the safeguard devices can destroy the functionality of the integrated circuit in two ways. First, one or more safeguard devices can interfere with the logical operation of an integrated circuit by, for example, shorting a signal lead to ground. Second, one or more safeguard devices can interfere with the electrical operation of an integrated circuit by, for example, shorting $V_{DD}$ to ground. This technique works by depriving the utile devices on the integrated circuit of electrical power.

DETAILED DESCRIPTION

For clarity of explanation, the illustrative embodiments of the present invention are presented as comprising individual "operational" blocks. The functions or operations indicated by these blocks are provided via various well known semiconductor-processing techniques, including, for example, photolithography, and doping or implantation. Since those skilled in the art are quite familiar with such processing techniques, they will be referenced without description as appropriate.

For the purposes of this Specification, the terms "circuit" and "device" are used interchangeably, unless other noted. Circuits exhibiting increased susceptibility to radiation are often termed "dose soft" or "radiation soft," and such terminology is adopted for use herein. For the purposes of this Specification, a circuit that is characterized as "dose soft," "radiation soft," "radiation susceptible," or "radiation intolerant" means that it is more susceptible to damage or aberrant operation due to ionizing radiation than circuits formed via conventional CMOS processing. The aberrant operation typically manifests as a substantial current leakage from, for, example, a transistor.

By way of illustration, not limitation, a dose-soft circuit is typically intolerant of (e.g., damaged by, deleteriously affected by, etc.) a total ionizing (radiation) dose ("TID") above about 50 Krad (Si), and even as low as 1 to 3 Krad (Si). "Total" dose signifies that the radiation exposure may occur over a period of time; in other words, TID is a cumulative dose. As the amount of radiation absorbed by different materials for a given exposure varies, radiation tolerance must be referenced to a particular material, such as silicon. The designation "dose-hard" is adopted for use herein to refer to circuits exhibiting a tolerance to TID consistent with circuits fabricated via conventional CMOS processing. Again, by way of illustration, not limitation, a dose-hard circuit should be expected to exhibit a TID tolerance in the range of about 50 to about 200 Krad (Si).

Figure 1:
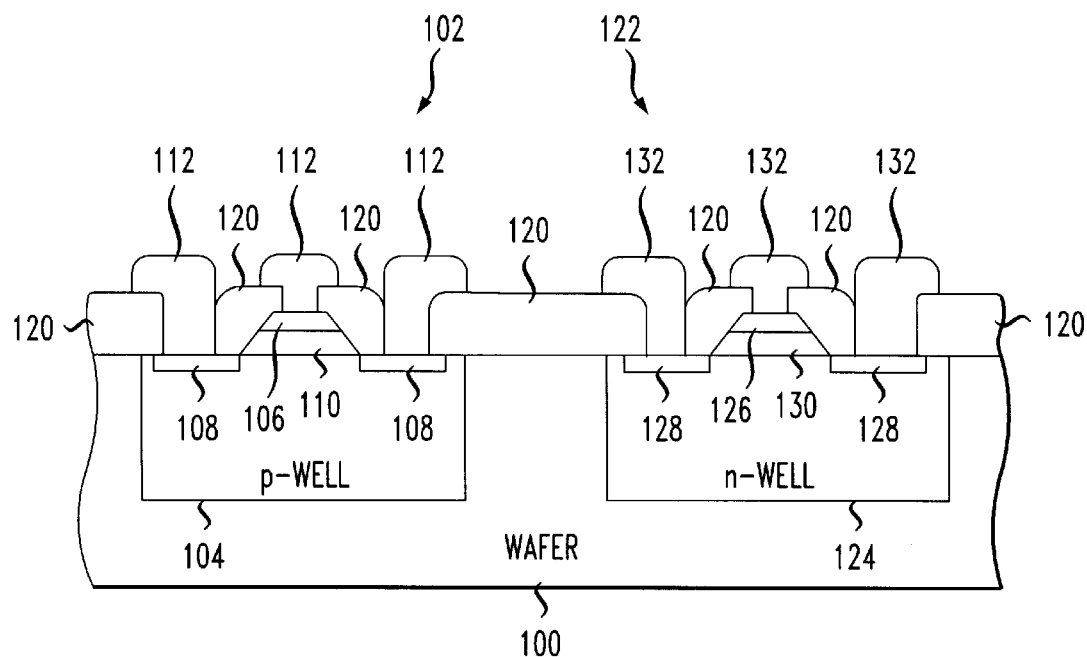
FIG. 1 depicts a portion of a conventional semiconductor circuit showing two field-effect transistors.
Figure 2:
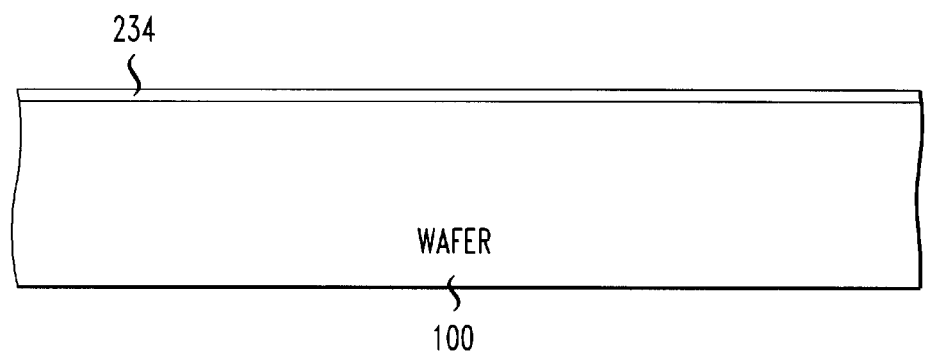
FIG. 2 depicts a screen-oxide layer deposited on a wafer in accordance with conventional CMOS manufacturing processes.

FIG. 1 depicts two conventional FETs 102 and 122 on wafer 100. Transistor 102 is depicted as an "N-channel" device, and transistor 122 is depicted as a "P-channel" device.

N-channel transistor 102 includes gate 106, source/drain 108 and P-well 104. Gate oxide or gate insulator 110 is disposed beneath gate 106. Dielectric 120, typically silicon dioxide, provides intra- and inter-transistor electrical insulation. Contacts 112, typically an electrical conductor such as aluminum, provide electrical contact to the gate, source and drain of the transistor. P-channel transistor 122 has substantially the same structure as transistor 102, and includes gate 126, gate oxide 130, source/drain 128 and electrical contacts 132. Since transistor 124 is a P-channel device, it has an N-well (i.e., N-well 124) rather than a P-well.

In the fabrication of a FET via conventional CMOS fabrication, a layer 234 is grown on the surface of a substrate 100 (e.g., a wafer, etc.) prior to N-well and P-well implantation. Layer 234, which is typically an oxide such as silicon dioxide, has a thickness of about 100 to 200 angstroms. Layer 234 aids in the distribution of N-type dopant atoms (e.g., antimony, arsenic, phosphorous) and P-type dopant atoms (e.g., boron, indium) into the wafer and also reduces out-gassing during annealing. In conventional CMOS processing operations, layer 234 is removed after N-well and P-well implantation and then the "gate oxide" or "gate insulator" is grown.

In recognition of this "screening" function, layer 234 is usually referred to as a "screen" layer. And, since layer 234 is typically an oxide, it is often referred to as a "screen oxide." To make it clear that layer 234 can comprise a material other than an oxide, it will be referred to herein as a "screen layer."

It is known that implanting through a screen layer comprising, for example, silicon dioxide or oxynitride, significantly degrades its radiation tolerance. In application of this fact, the present inventors recognized that a dose-soft device (e.g., transistor) can be fabricated via an easily-implemented modification to conventional CMOS technology. Specifically, a dose-soft device can be made by not removing the screen insulator at any location on the substrate where such a dose-soft device is desired.

Thus, in a method 300 for fabricating a dose-soft FET in accordance with the illustrated embodiment of the present invention, conventional CMOS processing is used up to and including the well-implant step, as indicated in operation block 302. Subsequently, in operation block 304, method 300 deviates from conventional CMOS processing in that the screen layer is not removed from the substrate (e.g., wafer, etc.).

Operation 304 advantageously facilitates removal of the screen layer at selected locations. The screen layer remains intact at other locations. This partial removal, (hereinafter "selectively removed," "selective removal," "selectively removing," etc.) provides a way to co-locate dose-soft and dose-hard devices on a substrate. Dose hard circuits are suitably formed at the locations at which the screen layer is removed, and dose soft circuits are suitably formed at the locations at which the screen layer remains.

Operation 304, selective removal of the screen layer, is advantageously performed using standard photolithographic processing steps. Further detail of operation 304 is provided in FIG. 4. In particular, as indicated at operation block 402, the screen insulator is covered with photoresist at locations on the substrate at which the screen insulator is to remain intact (i.e., locations at which dose-soft devices will be formed).

Figure 5:
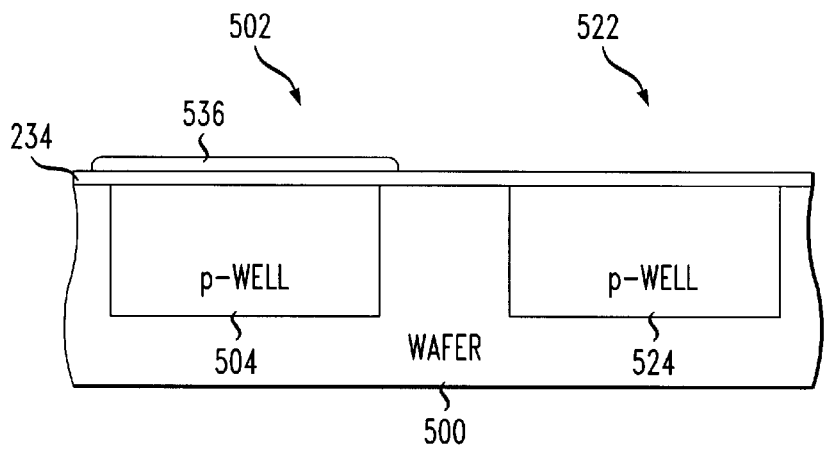
FIGS. 5, 6, 7A and 7B depict a dose-soft device and a dose-hard device in various stages of fabrication in accordance with the illustrative method.

FIG. 5 depicts a stage in the fabrication (i.e., after operation 402) of two transistors on a portion of a wafer 500. A dose-soft transistor is to be formed at region 502, and a dose-hard transistor is to be formed at region 522. At the stage of fabrication shown, P-well 504 and P-well 524 have already been implanted and screen layer 234 is partially covered by resist 536 in preparation for selective removal.

Figure 4:
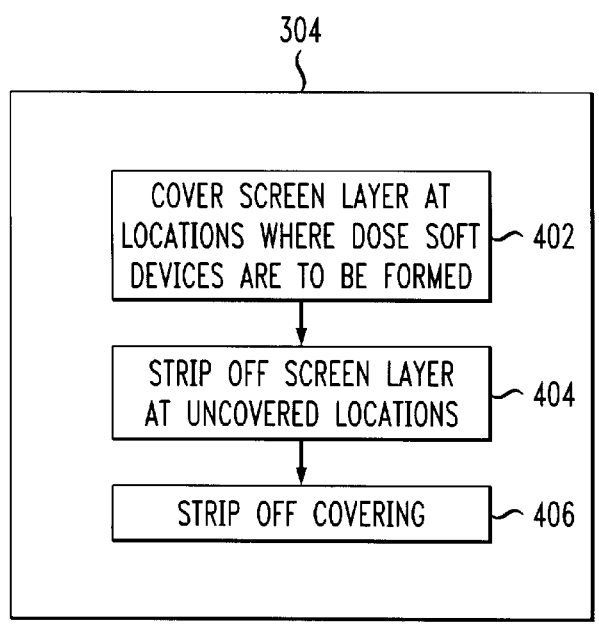
FIG. 4 depicts a method by which the screen insulator is selectively removed in accordance with the present invention.
Figure 6:
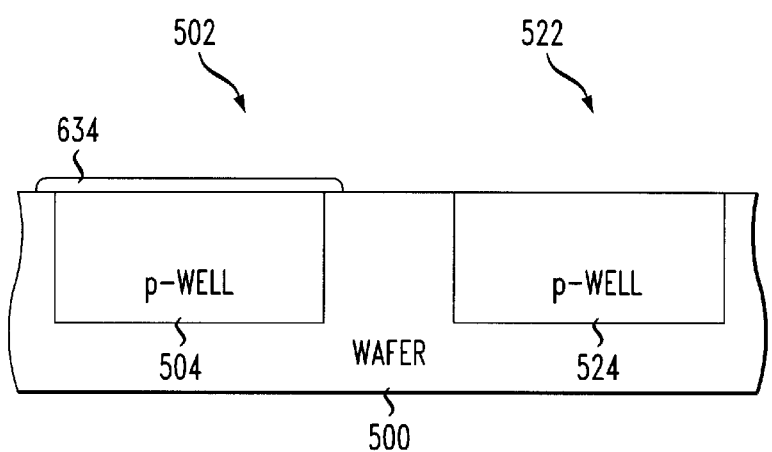

With continuing reference to FIG. 4, in operation block 404, any portion of the screen layer that is not covered by resist is stripped off. Dose hard devices can be formed at locations at which the screen layer is removed. Selective removal of the screen layer is performed using well known methods, such as, for example, placing the wafer in a standard tool containing HF acid (e.g., spray, vapor, tank or the like). After selectively removing the screen layer, the photoresist that covers portions of the screen layer is removed using standard resist-strip methods in operation block 406. FIG. 6 depicts the substrate after the uncovered portion of screen layer 234 has been removed, and after resist 536 has been removed. A portion 634 of the original screen layer thus remains at region 502.

Figure 3:
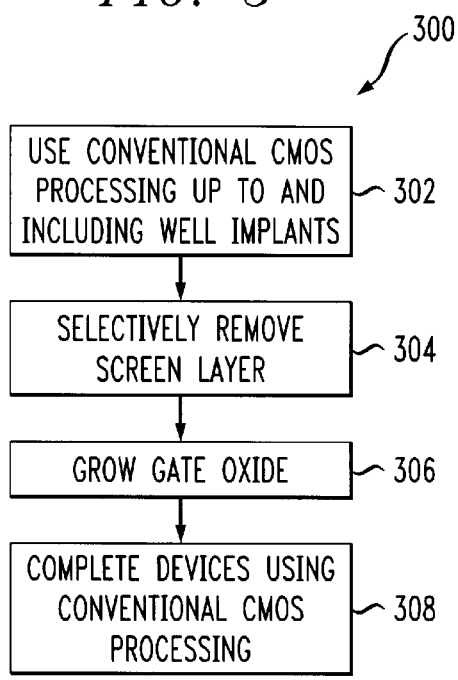
FIG. 3 depicts a block-flow diagram of a method for forming semiconductor devices and circuits in accordance with the illustrative embodiment of the present invention.
Figure 7A:
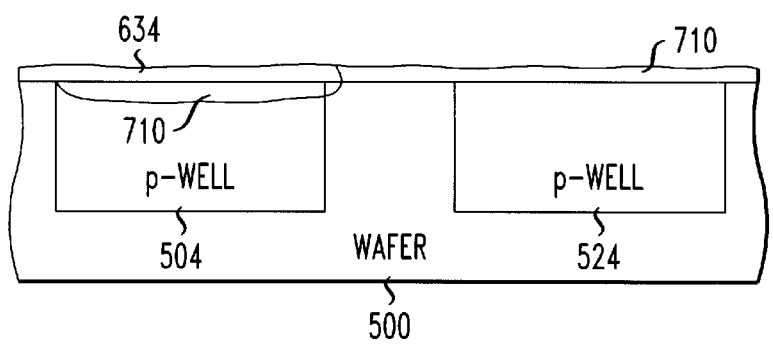
Figure 7B:
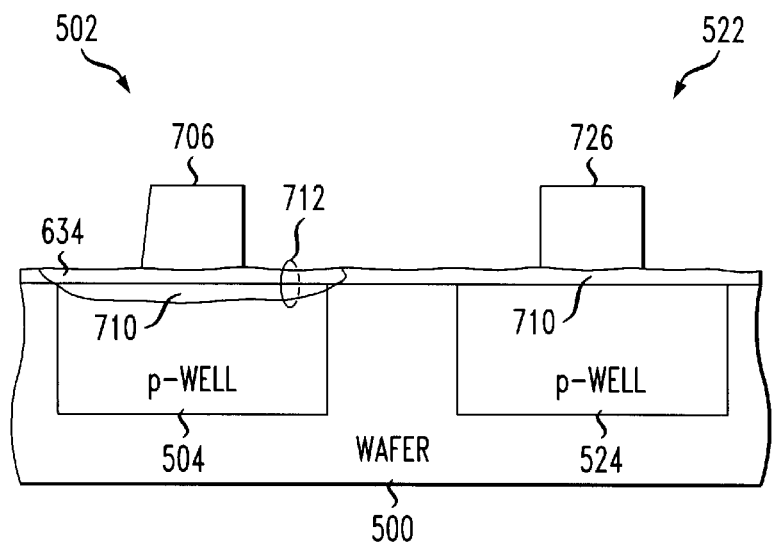

Referring again to FIG. 3, after resist removal, the gate insulator is grown as per operation block 306. FIG. 7A depicts gate insulator 710 underneath screen layer 634 and at the exposed surface of wafer 500. FIG. 7B depicts, after patterning, gate insulator 712 of the nascent transistor at region 502, which is an unconventionally-thick gate insulator that comprises screen layer portion 634 and newly-grown layer of insulator (e.g., oxide) 710. Gate 702 overlies gate insulator 712. As already described, a screen layer that has been implanted through, such as the screen layer portion 634, exhibits significantly increased radiation susceptibility. Moreover, growing additional oxide under the screen layer, which, in some embodiments, is itself an oxide layer, results in an overall increase in thickness of the oxide layer under gate 706, which further reduces dose hardness. A transistor formed in this manner will therefore be dose-soft.

FIG. 7B also depicts the gate and gate insulator regions of a nascent transistor at region 522. The gate insulator of the transistor being fabricated at region 522 comprises only the layer 710 of insulator grown in operation 306, since the screen layer over region 522 was removed. Gate 726 overlies the gate insulator. Since the TID-sensitive screen layer is not present at region 522, the transistor formed there is dose hard.

As indicated at operation block 308, the transistors are completed using conventional CMOS processing methodology.

In a further embodiment of the present invention, the present invention provides a method for fabricating an integrated circuit having increased susceptibility to ionizing radiation.

Figure 8:
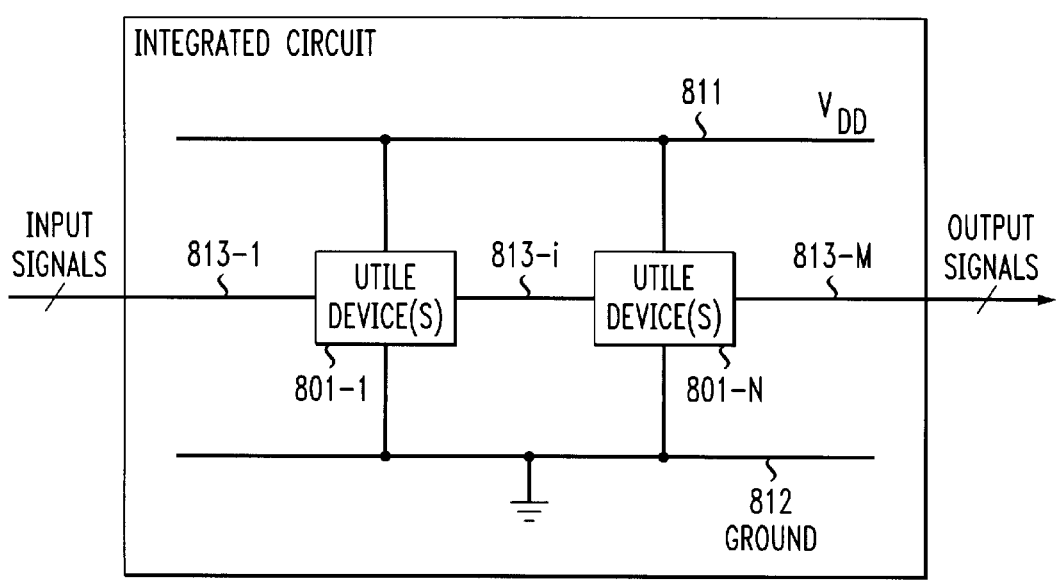
FIG. 8 depicts a block diagram of an integrated circuit in the prior art.

FIG. 8 depicts a block diagram of integrated circuit 800 in the prior art, which typically comprises a plurality of utile devices, utile devices 801-1 through 801-N, electrical conductors 811 for connecting utile devices 801-1 through 801-N to power, and electrical conductor 812 for connecting utile devices 801-1 through 801-N to ground. It will be clear to those skilled in the art that integrated circuits typically comprise many other elements (e.g., pads for receiving power and ground, etc.) than are depicted in FIG. 8, but these are not shown so that attention can be focused on those elements that are germane to an understanding of the present invention.

For the purposes of this specification, a "utile device" is a device that processes an information-bearing signal. The word "device," when used in the term "utile device," is defined as a transistor (i.e., both the operating transistor and a parasitic transistor, if one exists) and the surrounding materials (e.g., the field oxide, the gate dielectric, etc.) that affect the operating parameters (e.g., the effective threshold voltage, $V_T$, etc.) of the transistor. Utile devices can be operate in either analog mode or digital mode or both. Typically, the utile devices on an integrated circuit provide the functionality for which the circuit was designed, fabricated and utilized. For example, the utile devices on an integrated circuit might function as a microprocessor with a control sequencer and an arithmetic logic unit, a plurality of memory cells, an amplifier, etc.

As shown in FIG. 8, utile devices typically have: (i) input signals, which might be received from off of integrated circuit 800 or that might be generated by other utile devices, and (ii) output signals, which might be sent off of integrated circuit 800 or might be fed into other utile devices. It will be clear to those skilled in the art how to make and use one or more utile devices in accordance with the illustrative embodiment of the present invention.

Electrical conductor 811 and electrical conductor 812 can be metal bus lines or specific transistor diffusion nodes, as are well-known in the art, and it will be clear to those skilled in the art how to make and use electrical conductor 811 and electrical conductor 812 in conjunction with utile devices 801-1 through 801-N. It is well-known to those skilled in the art how to make and use integrated circuit 800.

Figure 9:
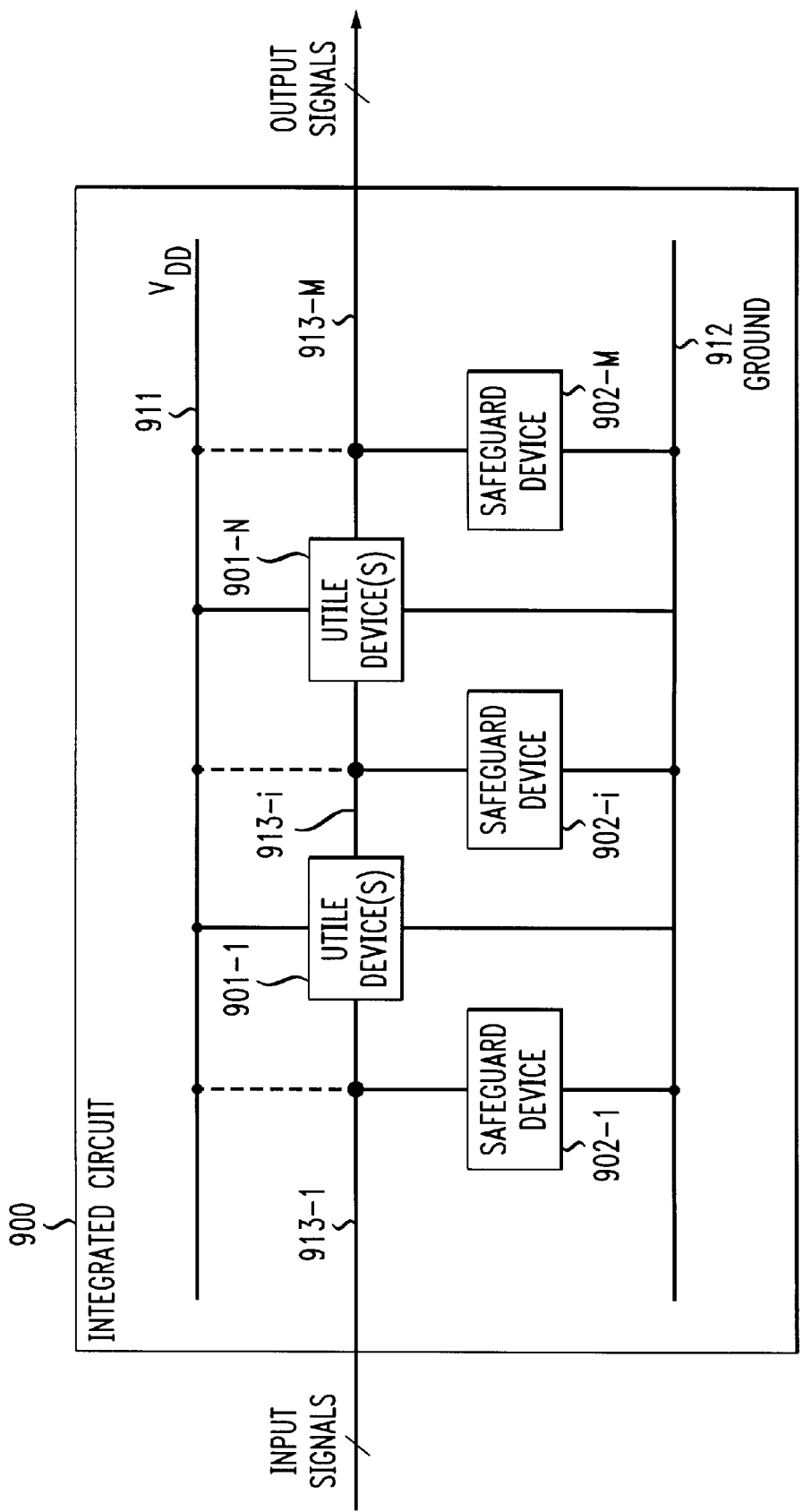
FIG. 9 depicts a block diagram of an integrated circuit in accordance with the illustrative embodiment of the present invention.

FIG. 9 depicts a block diagram of integrated circuit 900 in accordance with the present teachings. Integrated circuit 900 advantageously comprises a plurality of utile devices, utile devices 901-1 through 901-N, electrical conductors 911 for connecting utile devices 901-1 through 901-N to power, and electrical conductor 912 for connecting utile devices 901-1 through 901-N to ground.

In addition to these elements, integrated circuit 900 also advantageously comprises one or more "safeguard devices," such as safeguard devices 902-1 through 902-M. It will be clear to those skilled in the art that integrated circuit 900 can comprise elements (e.g., pads for receiving power and ground, etc.) in addition to those depicted in FIG. 9. These elements are not shown so that attention can be focused on those elements that are germane to an understanding of the present invention.

For the purposes of this specification, a "safeguard device" is defined as a device that is designed to interrupt the functioning of all or part of an integrated circuit when the integrated circuit is exposed to ionizing radiation. In general, the safeguard devices on the integrated circuit do not provide any functionality to the end-user and only exist so that they can completely or partially destroy the functionality of the integrated circuit when the integrated circuit is exposed to ionizing radiation. As a practical matter, most end users would probably prefer that the integrated circuit not contain a safeguard device because the presence of the safeguard device increases the susceptibility of the integrated circuit to failure.

The details of a safeguard device are discussed with respect to FIG. 10 below. Although one lead of a safeguard device is always tied to ground, the other lead can be either connected to power (i.e., $V_{DD}$) or to a signal lead (e.g., signal lead 913-i, etc.). The theory of operation of the illustrative embodiment is as follows: when integrated circuit 900 is exposed to ionizing radiation, a safeguard device shorts its two terminals together. When the safeguard device is connected between power and ground, the safeguard device shorts power to ground. When the safeguard device is connected between the signal lead and ground, the safeguard device shorts the signal lead to ground. In either case, the integrated circuit is affected. And this effect advantageously occurs at radiation dose levels that would not otherwise affect the operation of utile devices 901-1 through 901-N and integrated circuit 900.

The advantage of placing the safeguard devices between power and ground is that they can completely disable integrated circuit 900 from operating after exposure to a sufficient dose of radiation. The disadvantage of placing the safeguard devices between power and ground is that they might also short out all of the integrated circuits in the vicinity of integrated circuit 900.

The advantage of placing the safeguard devices between a signal lead and ground is that they can be used to selectively disable portions integrated circuit 900 from operating. The disadvantage of placing the safeguard devices between a signal lead and ground is that they might not sufficiently degrade the operation of integrated circuit 900.

From reading this specification, it will be clear to those skilled in the art how and where to place the safeguard devices on an integrated circuit to achieve a desire effect.

Electrical conductor 911 and electrical conductor 912 can be metal bus lines or specific transistor diffusion nodes, as are well-known in the art, and it will be clear to those skilled in the art how to make and use electrical conductor 911 and electrical conductor 912 in conjunction with utile devices 901-1 through 901-N, and safeguard devices 902-1 through 902-M.

Figure 10:
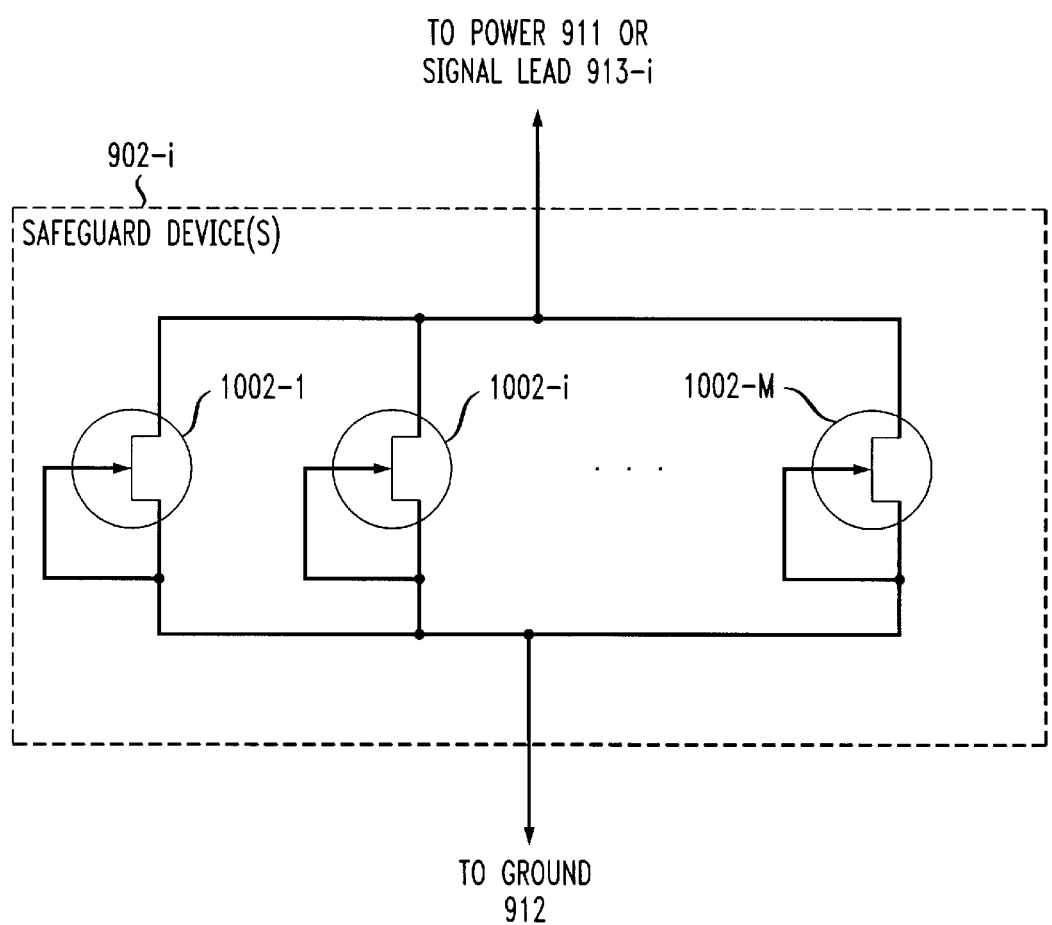
FIG. 10 depicts a schematic diagram of an illustrative safeguard device in accordance with an illustrative embodiment of the present invention.

FIG. 10 depicts a schematic diagram of illustrative safeguard device 902-i, in accordance with the illustrative embodiment of the present invention. Safeguard device 902-i advantageously comprises one or more n-type metal-oxide semiconductor field-effect transistors 1002-i (i.e., MOSFET) that are ganged in parallel, and so that their gates and sources are electrically connected to ground and so that their drains are electrically connected to either $V_{DD}$ or a signal lead.

This signal lead could be, for example, a chip enable that must have a high voltage in order for integrated circuit 900 to function. In this case, when integrated circuit 900 is exposed to ionizing radiation, safeguard device 902-i shorts. As a consequence, the chip enable, and, hence, integrated circuit 900, are disabled.

The salient characteristic of safeguard devices 902-1 through 902-M is that they are fabricated so as to be more susceptible to ionizing radiation than the utile devices 901-1 through 901-N, and, in fact, susceptible enough to ionizing radiation to pass the ITAR restrictions. Safeguard devices 902-1 through 902-M are advantageously fabricated in accordance with the teachings presented herein wherein the screen layer is not removed prior to growing the gate oxide.

Advantageously, each basic cell or group of utile devices is associated with one or more safeguard devices that are capable of preventing at least the associated utile devices from functioning. To accomplish this:

1. the safeguard devices are advantageously placed near their associated utile devices;
2. the amount of electrical resistance between the safeguard devices and their associated utile devices should be kept to a minimum; and
3. the safeguard devices should be designed and fabricated to have enough current capacity to affect the voltage on whichever of $V_{DD}$ or the signal lead they are attached to.

Figure 11:
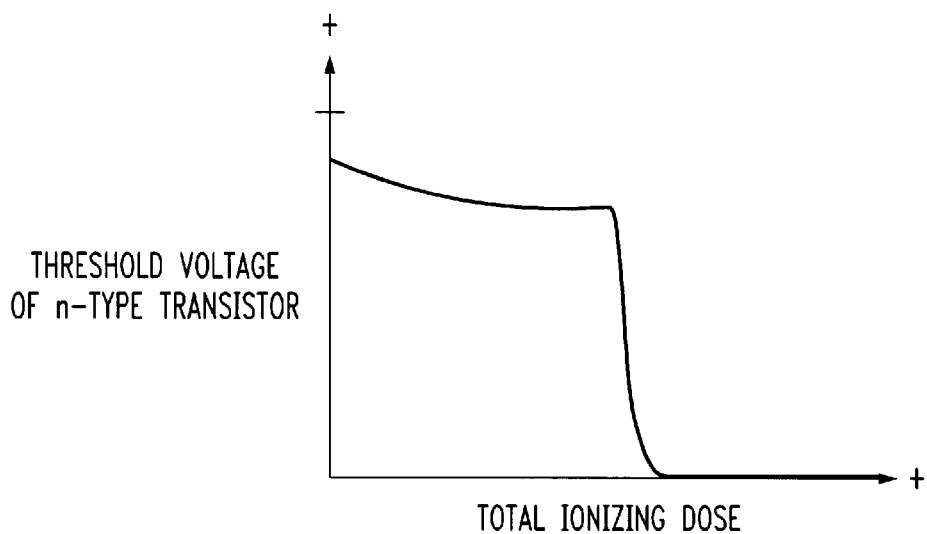
FIG. 11 depicts a graph of the effect of total ionizing dose on the threshold voltage of the safeguard device depicted in FIG. 10.

FIG. 11 depicts a graph of the threshold voltage, $V_T$, of safeguard device 902-i as a function of the amount of total ionizing dose radiation to which integrated circuit 900 has been exposed. In normal operation (i.e., when the total ionizing dose radiation is zero), the threshold voltage is high, the safeguard device is "off" (i.e., an open circuit) and the operation of the utile devices is unaffected. In contrast, when integrated circuit 900 has been exposed to ionizing radiation and the total ionizing dose increases, the threshold voltage eventually drops to the point where the safeguard device turns "on" (i.e., a closed circuit) and the operation of the utile devices is affected. It will be understood to those skilled in the art that the total ionizing dose might occur over an extended period (e.g., days, months, years, etc.).

Figure 12:
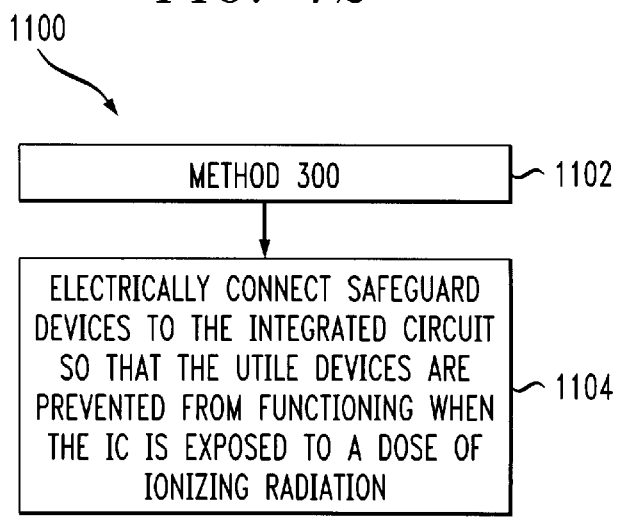
FIG. 12 depicts a block flow diagram of a method of fabricating the integrated circuit of FIG. 9.

FIG. 12 depicts a block flow diagram of a method 1100 for fabricating a dose-soft integrated circuit, such as integrated circuit 900. Operation 1102 of method 1100 comprises the operations of method 300. Method 1100 further includes operation 1104 wherein the dose-soft safeguard devices are electrically connected to elements of the integrated circuit such that on exposure to a sufficient dose of TID, utile devices are prevented from functioning. Electrical connection is effected as previously described. That is, one lead of a safeguard device is always tied to ground and the other lead can be either connected to power (i.e., $V_{DD}$) or to a signal lead (e.g., signal lead 913-i, etc.).

Additional detail concerning the fabrication and structure of radiation-susceptible integrated circuits is provided in the following commonly-owned, co-pending applications, filed on the same date as this application which was filed. These applications are incorporated by reference:

1. "Apparatus and Method for Manufacturing a Semiconductor Circuit," Ser. No., 09/590,809, (Attorney Docket 280-1/FE-00444);
2. "Increasing the Susceptibility of Integrated Circuits to Ionizing Radiation," Ser. No., 09/590,805, (Attorney Docket 280-3/FE-00439); and
3. "Semiconductor Circuit Having Increased Susceptibility to Ionizing Radiation," Ser. No., 09/592,473, (Attorney Docket 280-4/FE-00442).

It is to be understood that the above-described embodiments are merely illustrative of the invention and that many variations may be devised by those skilled in the art without departing from the scope of the invention and from the principles disclosed herein. It is therefore intended that such variations be included within the scope of the following claims and their equivalents.

We claim:

1. A method of operating an integrated circuit, said method comprising:
   processing signals with a utile device; and
   intefering with the operation of said utile device with a safeguard device comprising a transistor having a gate insulator that includes a screen layer, wherein said safeguard device interferes with the operation of said utile device when said integrated circuit is exposed to ionizing radiation.

2. The method of claim 1 wherein said exposure of said integrated circuit to ionizing radiation shorts an output of said utile device to ground through said safeguard device.

3. The method of claim 1 wherein said exposure of said integrated circuit to ionizing radiation disables the operation of said integrated circuit.

4. An article comprising:
   a first transistor disposed on a first region of a substrate, said first transistor having a gate insulator that includes:
   a screen layer having degraded radiation tolerance; and
   a layer of electrically-insulating material that abuts said screen layer; and
   a second transistor disposed on a second region of said substrate, said second transistor having a gate insulator that includes a layer of electrically insulating material, but not said screen layer.

5. The article of claim 4 wherein said electrically-insulating material is an oxide.

6. The article of claim 4 wherein the article is an integrated circuit comprising a microprocessor that comprises a control sequencer and arithmetic logic unit.

7. The article of claim 4 wherein the article is an integrated circuit comprising a plurality of memory cells.

8. The article of claim 4 wherein a first lead and a second lead of said first transistor is connected to ground, and a third lead of said first transistor is connected to power.

9. The article of claim 4 wherein a first lead and a second lead of said first transistor is connected to ground, and a third lead of said first transistor is connected to a signal lead.

10. An integrated circuit comprising:
   a utile device; and
   a safeguard device operatively coupled to said utile device and operative to interfere with operation of said utile device when said integrated circuit is exposed to ionizing radiation;

wherein said ionizing radiation does not affect internal operation of said utile device.

* * * * *